United States Patent
Grondahl et al.

(10) Patent No.: US 8,169,264 B2
(45) Date of Patent: May 1, 2012

(54) DISTRIBUTED DOHERTY AMPLIFIERS

(75) Inventors: Christopher D. Grondahl, Gilbert, AZ (US); Dean Lawrence Cook, Mesa, AZ (US)

(73) Assignee: ViaSat, Inc., Carlsbad, CA (US)

( * ) Notice: Subject to any disclaimer, the term of this patent is extended or adjusted under 35 U.S.C. 154(b) by 0 days.

(21) Appl. No.: 13/196,255

(22) Filed: Aug. 2, 2011

(65) Prior Publication Data
US 2011/0285467 A1 Nov. 24, 2011

Related U.S. Application Data

(63) Continuation of application No. 12/265,532, filed on Nov. 5, 2008, now Pat. No. 8,013,680.

(60) Provisional application No. 60/985,588, filed on Nov. 5, 2007.

(51) Int. Cl.
*H03F 3/68* (2006.01)
(52) U.S. Cl. ........................ 330/295; 330/286
(58) Field of Classification Search .............. 330/295, 330/285, 296, 124 R, 84, 126, 286, 54
See application file for complete search history.

(56) References Cited

U.S. PATENT DOCUMENTS

| | | | | |
|---|---|---|---|---|
| 6,914,483 B2 * | 7/2005 | Shigaki | ........................ | 330/136 |
| 7,221,219 B2 * | 5/2007 | Hellberg et al. | .......... | 330/124 R |
| 7,821,337 B2 * | 10/2010 | Yamanouchi et al. | ........ | 330/149 |
| 7,843,262 B2 * | 11/2010 | Takenaka | ..................... | 330/136 |

* cited by examiner

*Primary Examiner* — Henry Choe
(74) *Attorney, Agent, or Firm* — Snell & Wilmer L.L.P.

(57) ABSTRACT

Doherty and distributed amplifier (DA) designs are combined to achieve, wideband amplifiers with high efficiency dynamic range. A modified Doherty amplifier includes a wideband phase shifter providing first and second outputs, a main amplifier coupled to the first output, an auxiliary amplifier coupled to the second output, and a wideband combining network combining the outputs in phase. A multi-stage DA has a main output and a termination port, and a phase delay module and transforming network allowing power at the termination port to be combined in phase with power at the main output. In one combination, one or more stages of the DA may comprise a Doherty amplifier. In another combination, a modified series-type Doherty amplifying system is achieved by cascading main and auxiliary DAs. In any combination, Doherty topology may include a bias control module.

18 Claims, 6 Drawing Sheets

DISTRIBUTED DOHERTY AMPLIFIERS

CROSS-REFERENCE TO RELATED APPLICATIONS

This application is a continuation application of application Ser. No. 12/265,532, titled "DISTRIBUTED DOHERTY AMPLIFIERS" filed Nov. 5, 2008, which is a non-provisional application of U.S. Provisional Application No. 60/985,588, filed Nov. 5, 2007, both of which are fully incorporated herein by reference.

FIELD OF THE INVENTION

The present invention relates generally to electronic amplifiers, and more specifically to employing Doherty amplifiers in a distributed amplifier topology to improve amplifier bandwidth and efficiency.

BACKGROUND OF THE INVENTION

In electronics, there is an ongoing need to improve the efficiency and bandwidth of amplifier circuits. For example, in RF and microwave systems, wideband amplifiers are essential components for boosting signals in a wide range of technology, from telecommunications equipment to radar and electronic warfare systems. However, improvements in amplifier bandwidth are often made at the expense of amplifier efficiency, and vice versa.

One method for improving the efficiency of an amplifier was invented in 1934 by William H. Doherty. The so-called Doherty amplifier is shown in FIG. 1. It consists of a class-B main amplifying stage 11 in parallel with a class-C auxiliary amplifier stage 13. There are two quarter-wave transformers, $L_I$ and $L_O$, provided at the input of auxiliary amplifier 13 and at the output of main amplifier 11, respectively. The input signal is split evenly to drive the two amplifiers, and a combining network 15 sums output signals from the main and auxiliary stages and corrects for phase differences between them. During periods of low signal level, the main stage efficiently amplifies the input signal and the auxiliary stage remains off. During high power signal peaks, the main stage saturates and the auxiliary stage turns on. This increases overall efficiency dynamic range (which is the input power range over which efficiency remains high) by about 6 dB. While the Doherty amplifier is effective in boosting the efficiency dynamic range, it is not well suited for wideband applications due to inherent bandwidth limitations.

A well-known wideband amplifier known as a distributed amplifier (DA) was invented by William S. Percival in 1936. DA architecture introduces delay to achieve wideband characteristics. One model of a DA is shown in FIG. 2. The DA consists of a pair of transmission lines (an input line 17 and an output line 19) with characteristic impedances ZI (1 to 5) and ZO (1 to 5) independently connecting the inputs and outputs of several active devices, as shown. In this example, the active devices are modeled as field effect transistors (FETs) Q1, Q2, Q3, Q4. As an input signal propagates down the input line 17, the individual FETs respond to the forward-traveling input step by inducing an amplified forward-traveling wave on the output line 19. The gain of a DA is additive rather than multiplicative, and is determined in part by the number of stages. This property enables the DA to provide gain at frequencies beyond that of the unity-gain frequency of any individual stage. The delays of the input and output lines can be made equal through selection of propagation constants and line lengths to ensure that the output signals from each individual device sum in phase. However, a major drawback to the DA is poor efficiency, because power matching and phasing cannot be achieved at the same time. As a result, much of the output power is wasted in the termination load 21.

The foregoing discussion illustrates the tradeoff of efficiency for bandwidth in the design of electronic amplifiers. What is needed to meet industrial demand is a highly efficient wideband amplifier.

SUMMARY OF THE INVENTION

In accordance with an exemplary embodiment of the present invention, a high efficiency, wideband amplifier is provided for applications in RF, microwave, and other electronic systems. In one exemplary embodiment, a building block of the invention is a Doherty type amplifier. For example, the Doherty type amplifier may include a wideband phase shifter for receiving an input signal and providing first and second outputs, a main amplifier coupled to the first output, an auxiliary amplifier coupled to the second output, and a wideband combining network combining amplified signals from the main and auxiliary amplifiers into a combined output. In one embodiment, either or both of the main and auxiliary amplifiers may be a cascaded reactively terminated single-stage distributed amplifier (CRTSSDA). The wideband phase shifter splits the input signal into first and second phase-shifted signals, the first and second phase-shifted signals having a phase difference, the first phase-shifted signal being input to the main amplifier and the second phase-shifted signal being input to the auxiliary amplifier, whereby the phase difference ensures that the amplified signals from the main and auxiliary amplifiers combine in phase at the wideband combining network.

In accordance with another exemplary embodiment, a second building block of the invention is a wideband DA designed for high efficiency. The DA may have an output and a termination port, a phase delay module coupled to the termination port, and a transforming network coupled between the phase delay module and the output. The phase delay module allows power that would otherwise be wasted in the termination port to be combined in phase with power at the output. The transforming network provides optimal impedance matching for the combined signals.

Exemplary embodiments of invention combine the Doherty and DA building blocks to produce high efficiency, wideband amplifiers. In one embodiment, a DA according to the invention may have multiple stages, wherein at least one of the stages comprises a Doherty unit cell. The Doherty unit cell may include a bias control module for optimizing the duty cycle of an auxiliary amplifier. Alternatively, the Doherty unit cell may comprise a CRTSSDA. In another embodiment, a series-type Doherty amplifying system may be achieved by cascading main and auxiliary DAs. This amplifying system includes a main DA having a main output and a main termination port, an auxiliary DA coupled to the main termination port and having an auxiliary output and an auxiliary termination port, a first phase delay module coupled between the main output and the auxiliary output, and a second phase delay module coupled between the auxiliary termination port and the auxiliary output. One or more transforming networks may also be coupled to the auxiliary output. The phase delay units and transforming networks allow signals from the main output, auxiliary output, and auxiliary termination port to be combined in phase at optimal impedance for high efficiency, wideband amplification.

BRIEF DESCRIPTION OF THE DRAWINGS

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims. Component parts shown in the drawings are not necessarily to scale, and may be exaggerated to better illustrate the important features of the invention. In the drawings, like reference numerals designate like parts throughout the different views, wherein:

DETAILED DESCRIPTION OF THE INVENTION

The following disclosure presents various exemplary embodiments of the invention for providing high-efficiency wideband electronic amplifiers. Generally, the invention makes possible the combination of wideband features of DAs with high efficiency features of Doherty amplifiers. The following exemplary embodiments are disclosed: (i) a Wideband Doherty Amplifier Using CRTSSDAs, (ii) a High Efficiency Distributed Amplifier, (iii) a Wideband Doherty Distributed Amplifier, and (iv) a Wideband Series-Type Doherty Amplifier Using Distributed Amplifiers.

Wideband Doherty Amplifier Using Cascaded Reactively Terminated Single-Stage Distributed Amplifiers (CRTSSDAs)

Figure 3:
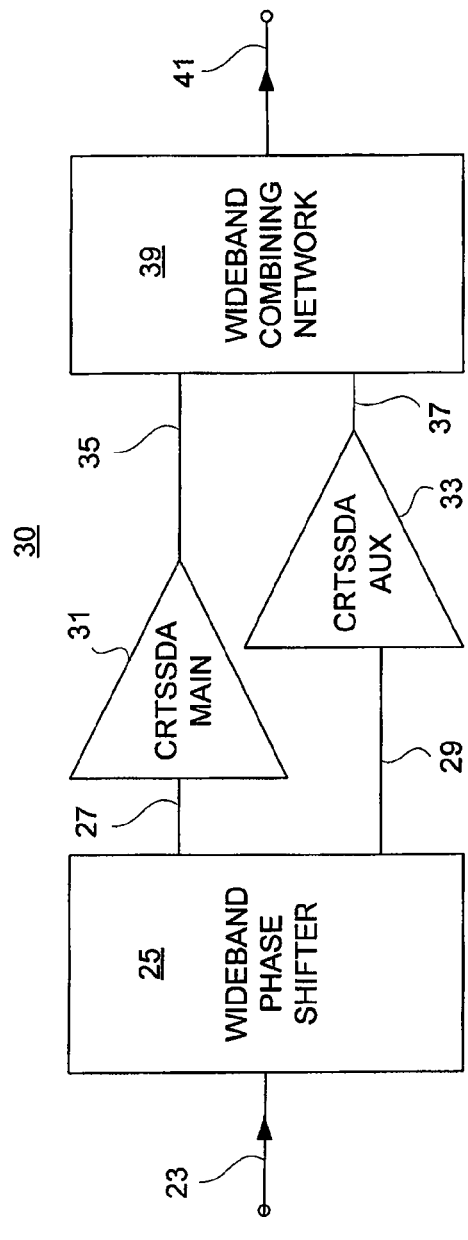
FIG. 3 is a block diagram of one exemplary embodiment of a high efficiency wideband Doherty amplifier in accordance with an exemplary embodiment of the invention.

With reference now to the block diagram of FIG. 3, and in accordance with an exemplary embodiment of the present invention, a wideband amplifier 30 is configured to increase the bandwidth of a conventional Doherty amplifier. An input signal to be amplified is received at input terminal 23 by a wideband phase shifter 25, which in one exemplary embodiment may be a Hittite model HMC649 or equivalent. Wideband phase shifter 25 splits the received input signal into two phase-shifted input signals 27 and 29. Phase-shifted input signal 27 is fed to a main amplifier 31 and phase-shifted input signal 29 is fed to an auxiliary amplifier 33. The main and auxiliary amplifiers are arranged in a Doherty configuration, with their respective output signals 35 and 37 combined in a wideband combining network 39. Combining network 39 provides a wideband output signal 41. For example, combining network 39 may sum output signals from the main and auxiliary amplifiers and correct for phase differences between them. This novel combination of features—a wideband phase shifter receiving an input signal and providing first and second outputs, a main amplifier coupled to the first output, an auxiliary amplifier coupled to the second output, and a wideband combining network combining amplified signals from the main and auxiliary amplifiers into a combined and phase corrected output—achieves wideband performance in a Doherty-type amplifier.

In one embodiment, the main amplifier 31 and auxiliary amplifier 33 may be cascaded reactively terminated single-stage distributed amplifiers (CRTSSDAs), as described, for example, by Virdee, A. S. et al., "A Broadband 2 to 18 GHz Cascaded Reactively Terminated Single-stage Distributed Amplifier," Microwave Journal, September 2000, which is fully incorporated herein by reference. CRTSSDAs are multistage amplifiers. Each amplifier stage forms a tee network with series inductance and shunt capacitance, similar to a transmission line model. An equivalent transmission line is known to have wideband characteristics, hence the CRTSSDA circuit may provide wideband operation. To combine a main CRTSSDA and an auxiliary CRTSSDA for Doherty operation according to the invention, the inputs to main amplifier 31 and auxiliary amplifier 33 are connected through wideband phase shifter 25. Phase shifter 25 may enable selection of a phase difference or phase relationship between the main and auxiliary amplifier input signals 27 and 29 to ensure that the amplifier outputs 35 and 37 add in phase at output 41, or may be combined in phase by wideband combining network 39.

In one embodiment, wideband combining network 39 may include one or more wideband inverters, wideband transformers, and/or phase shifters. The wideband combining network 39 may apply proper loading to the main and auxiliary amplifiers 31 and 33 to optimize power transfer. For example, wideband combining network 39 may include a harmonic tuning feature that provides a desired load at the fundamental and at one or more harmonic frequencies. Wideband combining network 39 may also provide proper impedance inversion to the main amplifier 31.

Figure 4:
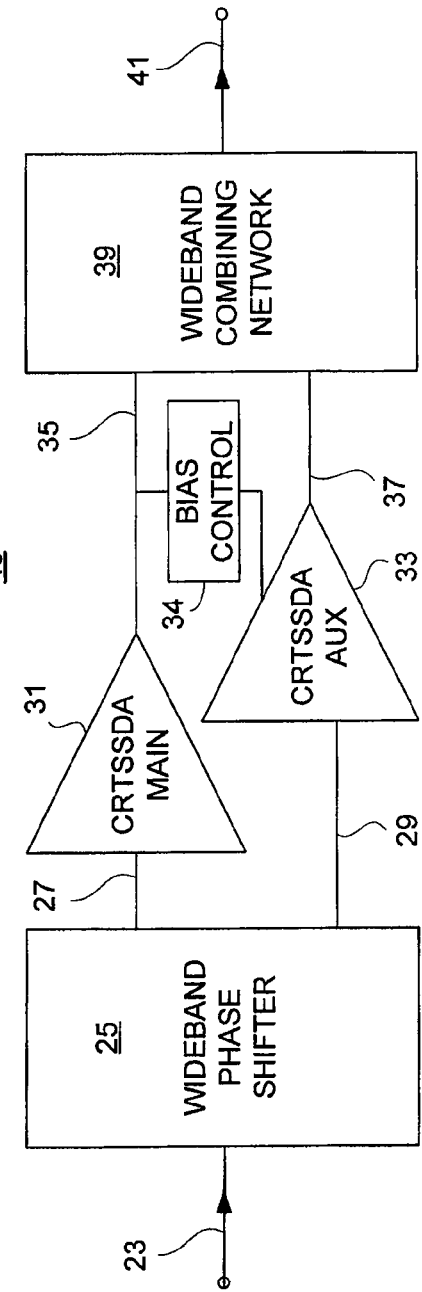
FIG. 4 is another block diagram of an exemplary embodiment of a high efficiency wideband Doherty amplifier in accordance with an exemplary embodiment of the invention.

FIG. 4 shows a block diagram of a wideband amplifier 40 according to the invention that includes a bias control feature for optimizing switching characteristics of the auxiliary amplifier. Wideband amplifier 40 is otherwise similar to wideband amplifier 30. The bias control feature of wideband amplifier 40 automatically adjusts an input bias to auxiliary amplifier 33 responsive to power detected at output 35 or at output 41. In operation, the detected output power may be sampled at a suitable sampling frequency, a bias level may be determined based on the sampled power, and the input bias may be controlled to optimize efficiency. The bias control may be designed to predict, based on the detected output power, when the main amplifier enters or leaves saturation. For example, efficiency of amplifier 30 may be optimized by turning on auxiliary amplifier 33 as main amplifier 31 approaches saturation, and by turning off auxiliary amplifier 33 as main amplifier 31 returns from saturation to a normal operating range. In the exemplary embodiment 40, a bias control module 34 may provide a feedback signal from main amplifier output 35 to the auxiliary amplifier 33. By predicting the saturation condition of the main amplifier 31, a wideband amplifier according to the invention may increase overall efficiency by improving the accuracy (i.e. timing) of auxiliary amplifier switching.

High Efficiency Distributed Amplifier

Figure 5:
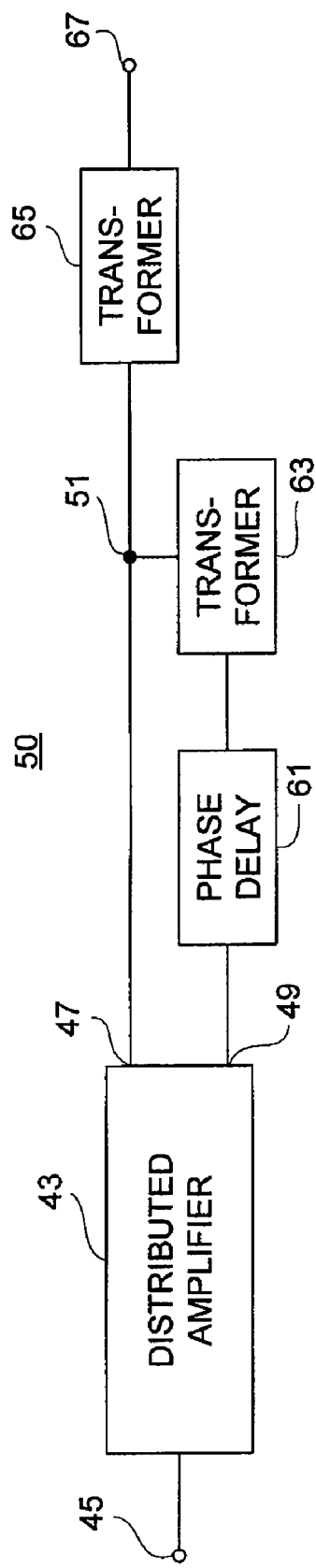
FIG. 5 is a block diagram of one exemplary embodiment of a high efficiency DA in accordance with an exemplary embodiment of the invention.

FIG. 5 illustrates another aspect of an exemplary embodiment of the invention for achieving both wideband and high efficiency amplification in a DA. Generally, DAs exhibit poor efficiency because a significant percentage of power is dissipated in the termination load 21, particularly when power matching is attempted. In accordance with an exemplary embodiment, a DA improves amplifier efficiency by combining with the output of the DA the power that would otherwise be lost in the termination load.

In exemplary amplifier circuit 50, a DA 43 has an input 45, an output 47, and a termination port 49. The signal at termination port 49 is coupled to output 47 at node 51 through a phase delay module 61 and a transformer circuit or transformer 63. Phase delay module 61 ensures that the signal from termination port 49 combines in phase with the signal from output 47. Transformer 63 may be provided for proper impedance matching. A second transformer circuit or transformer 65 may be provided between node 51 and main output 67 for impedance matching of the combined output signal with a load connected to main output 67. In one exemplary embodiment, DA 43 may be a Hittite model HMC-0026 device or equivalent. In another embodiment, DA 43 may include one or more Doherty unit cells, such as the novel Doherty circuits described above, or the Doherty unit cell 70 described below.

Figure 6:
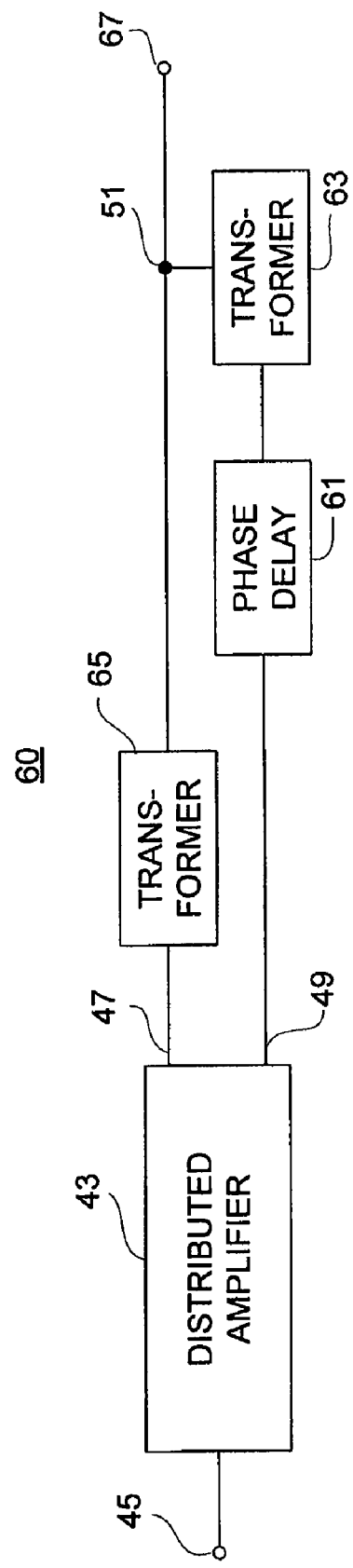
FIG. 6 is a block diagram of another exemplary embodiment of a high efficiency DA in accordance with an exemplary embodiment of the invention.

In another embodiment of a high efficiency DA, transformer circuits 63 and 65 may be impedance matching transformers. The arrangement of impedance matching transformers 63 and 65 within the amplifier circuit may vary in different embodiments of the invention. For example, FIG. 6 shows amplifier circuit 60, which is identical to circuit 50 except for placement of transformer 65. In this exemplary embodiment, transformer 65 is coupled directly between output 47 and node 51. The novel combination of features shown in FIG. 5 and in FIG. 6—a distributed amplifier receiving an input signal and having an output and a termination port, a phase delay module coupled to the termination port, and a transforming circuit coupled between the phase delay module and the output, whereby power from the termination port combines in phase with power at the output—significantly improves efficiency in a distributed amplifier.

Wideband Doherty Distributed Amplifier

Figure 7:
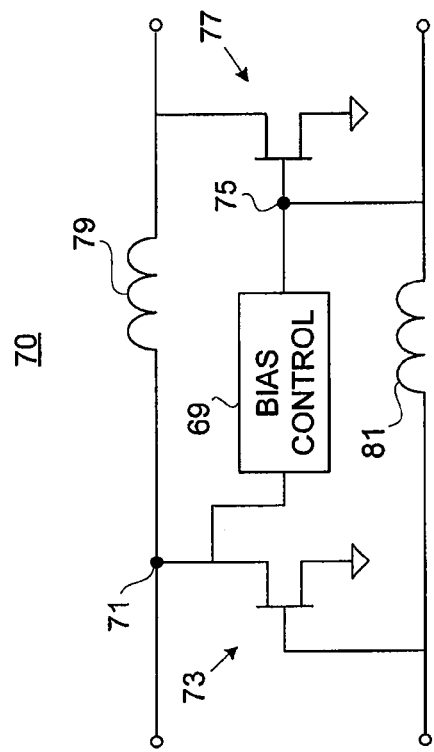
FIG. 7 is a circuit diagram illustrating one exemplary embodiment of a Doherty unit cell in accordance with an exemplary embodiment of the invention.
Figure 8:
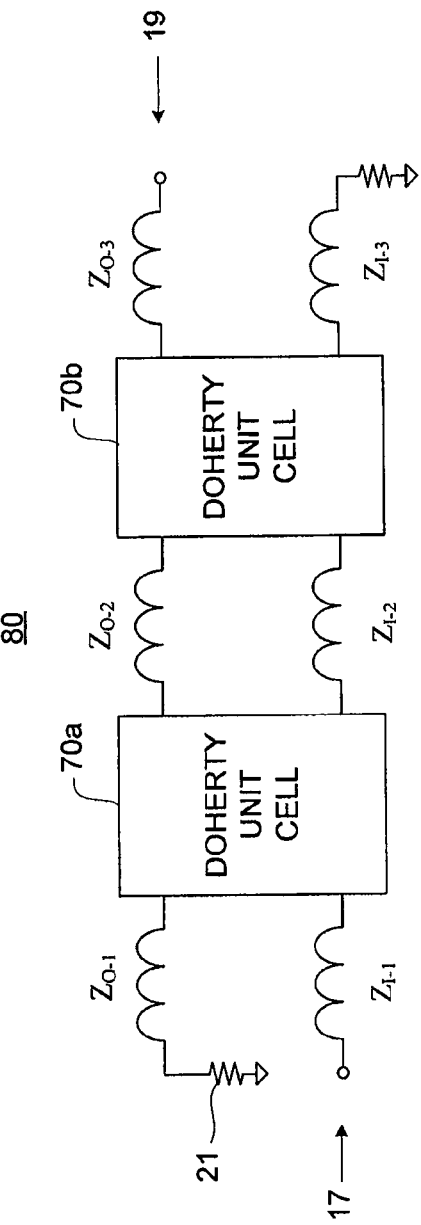
FIG. 8 is a circuit diagram illustrating one exemplary embodiment of a high efficiency DA using Doherty unit cells in accordance with an exemplary embodiment of the invention.

FIG. 7 and FIG. 8 illustrate another exemplary embodiment of a high efficiency DA according to the invention. This embodiment increases the bandwidth and the efficiency dynamic range of an amplifier by combining Doherty and DA concepts. In this example, a DA is constructed using Doherty unit cells to build amplifier-coupled wideband transmission lines. The Doherty unit cell 70 shown in FIG. 7 is modeled as a simplified Doherty circuit with single FETs serving as main and auxiliary amplifiers.

Doherty unit cell 70 uses Doherty amplifier topology, but also includes a bias control module 69 coupled between the output 71 of main amplifier 73 and the input 75 of auxiliary amplifier 77. Bias control module 69 monitors output 71, for example, through continuous detection or sampling, and responsive to the detected power level, adjusts the bias voltage at input 75 to optimize the duty cycle of the auxiliary amplifier. In accordance with a different exemplary embodiment, bias control may be implemented via other methods now known, or hereinafter discovered. For example, bias control module 69 may be configured to adjust the bias voltage based on sensing of a DC current (e.g., the DC current to the amplifier(s)) and determining a compression point based on the sensed DC current. This exemplary technique is described in more detail in U.S. Pat. Nos. 7,006,791 and 6,771,930, which are incorporated herein by reference.

In addition to bias control module 69 and amplifiers 73 and 77, Doherty unit cell 70 may include impedance transforming elements 79 and 81 modeled as inductors in the circuit diagram.

Figure 1:
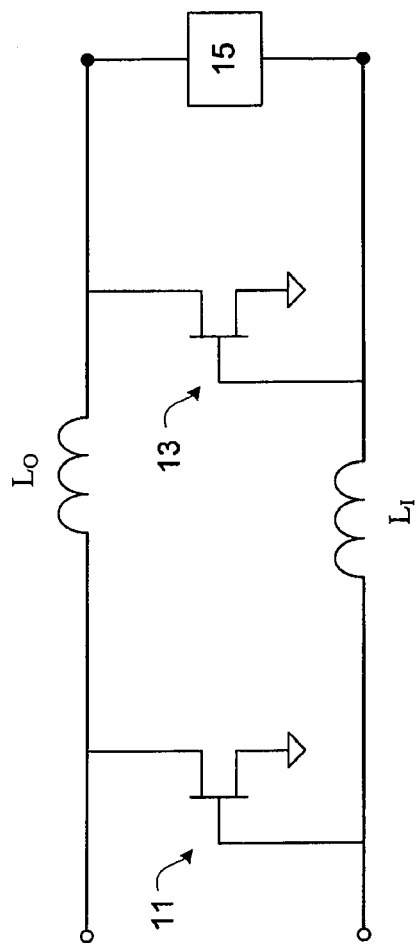
FIG. 1 is a schematic representation of a conventional Doherty amplifier.
Figure 2:
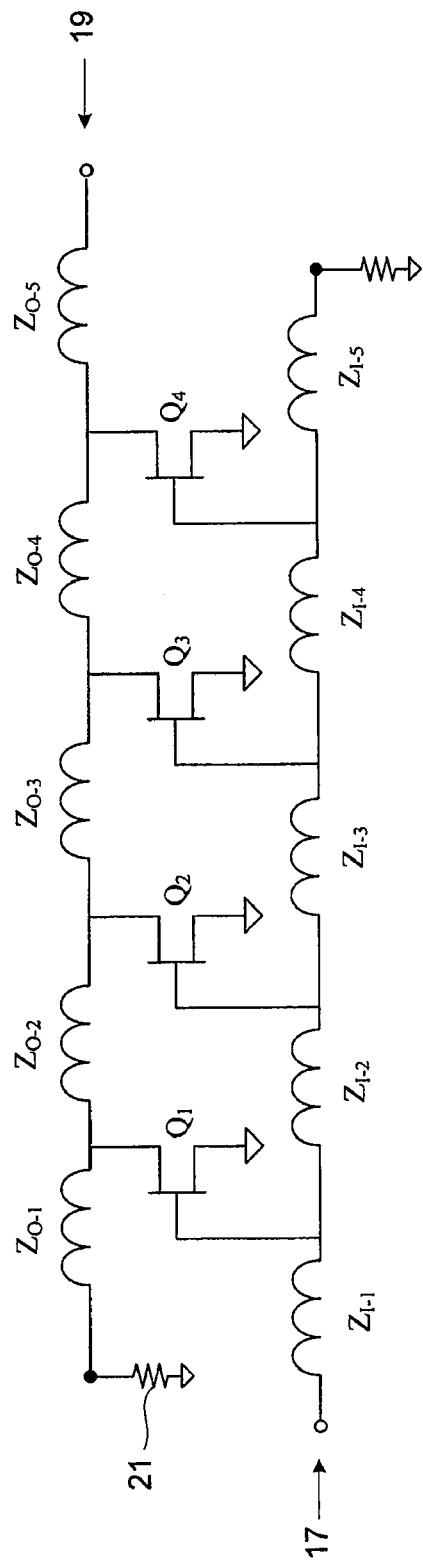
FIG. 2 is a schematic representation of a conventional DA.

With reference now to FIG. 8, in an exemplary embodiment circuit 80 comprises a DA, wherein the DA is constructed using multiple Doherty unit cells 70. It may be observed that each Doherty unit cell (70a or 70b) in circuit 80 approximately replaces any two consecutive amplifier stages in the DA topology of FIG. 2. That is, a first Doherty unit cell 70a may replace that portion of the circuit of FIG. 2 comprising Q1, Q2, $Z_{I-2}$ and $Z_{O-2}$, and a second Doherty unit cell 70b may replace that portion of the circuit of FIG. 2 comprising Q3, Q4, $Z_{I-4}$ and $Z_{O-4}$. Thus, circuit 80 forms a distributed Doherty amplifier, or equivalently, a plurality of Doherty unit cells cascaded as a distributed amplifier. Each Doherty unit cell 70a, 70b includes a bias control module, e.g., module 69 of FIG. 7, to ensure high efficiency, with each Doherty unit cell connected across a pair of transmission lines (or virtual transmission lines) 17 and 19 that give the amplifier a wideband transfer characteristic. The innovative design of a distributed amplifier having multiple stages, wherein at least one of the stages comprises a Doherty unit cell, achieves a high-efficiency, wideband amplifier. Other embodiments of the invention are possible, wherein Doherty unit cells are imbedded within the topology of a DA. For example, the DA 43 of circuit 50 may be composed at least partially of Doherty unit cells as shown in circuit 80.

Wideband Series-Type Doherty Amplifier Using Distributed Amplifiers

Figure 9:
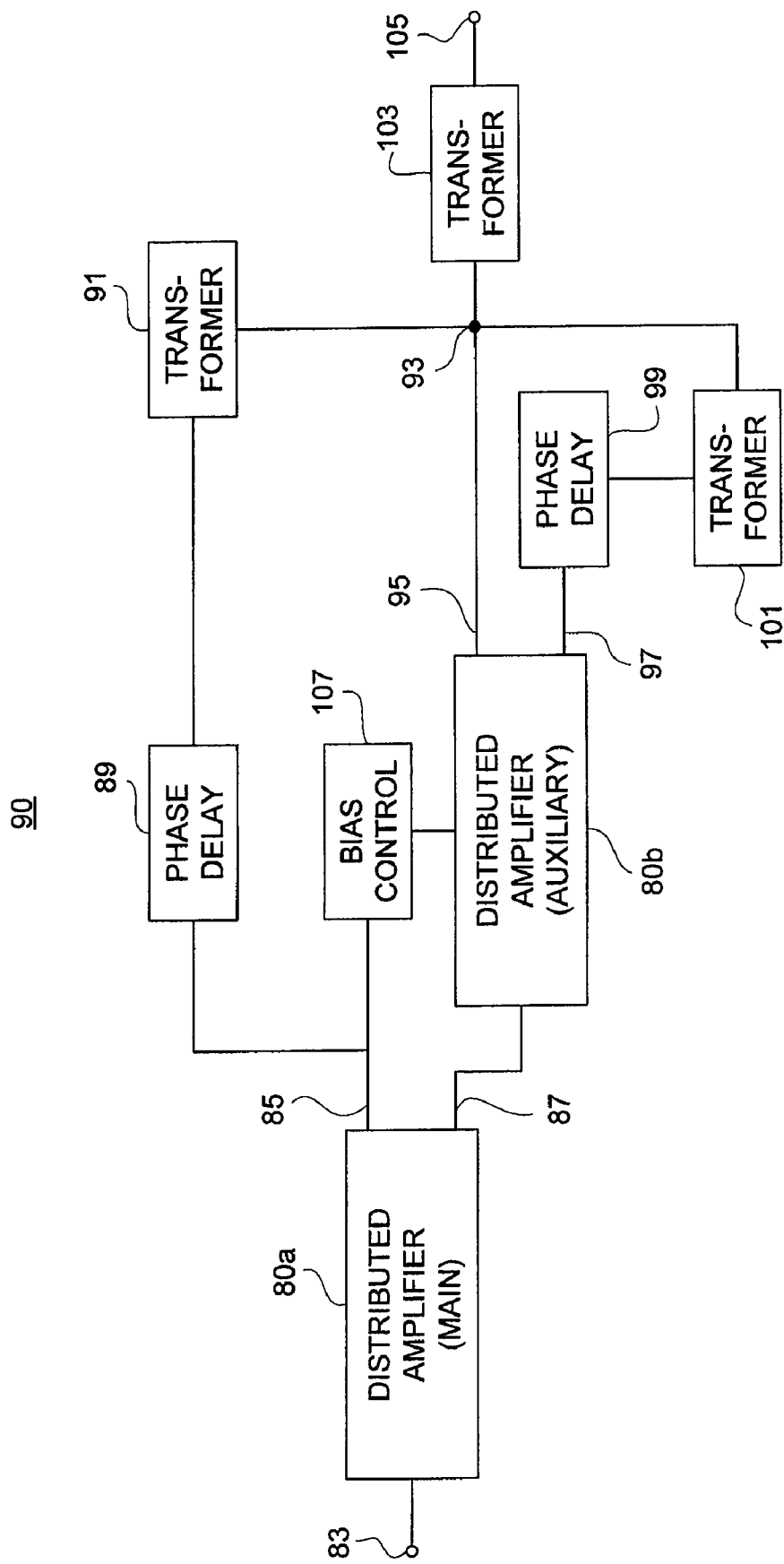
FIG. 9 is a block diagram of one exemplary embodiment of a high-efficiency wideband amplifier using DAs as main and auxiliary stages in a series-type Doherty topology in accordance with an exemplary embodiment of the invention.
Figure 10:
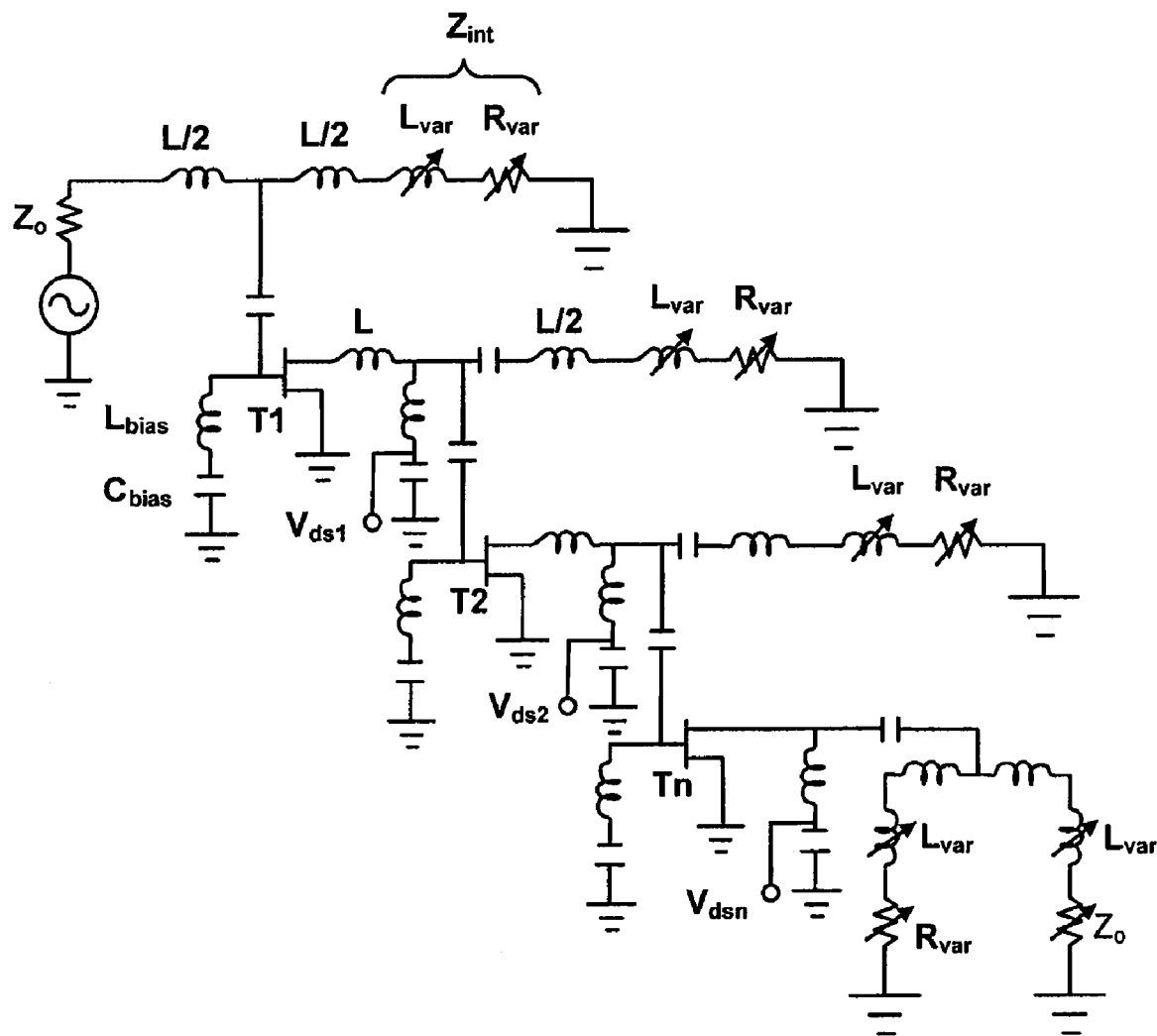
FIG. 10 depicts an exemplary prior art cascaded reactively terminated single-stage distributed amplifier (CRTSSDA) circuit diagram.

FIG. 9 illustrates an embodiment of a system 90 according to an exemplary embodiment of the invention for increasing the bandwidth of a series-type Doherty amplifier. In this embodiment, an input signal to be amplified is applied via input port 83 to main amplifier 80a. Main amplifier 80a comprises, for example, a DA having a topology similar to that depicted in circuit 80. However, rather than allowing power to dissipate at a termination port, in system 90 the termination port may be connected in series with an auxiliary amplifier 80b. Auxiliary amplifier 80b may also be a DA having a topology similar to circuit 80. Thus, the DA circuitry of each amplifier 80a and 80b may comprise a plurality of Doherty unit cells 70. System 90 may therefore provide a series-type Doherty amplifier comprising a main distributed Doherty amplifier 80a in series with an auxiliary distributed Doherty amplifier 80b.

In a series-type distributed Doherty amplifier system according to the invention, most of the output power from main amplifier 80a may be fed through main output 85, while the remaining power may be fed through main termination port 87 to the input of auxiliary amplifier 80b. The signal at output 85 may be coupled to a phase delay module 89, which may be connected through a transformer network 91 to node 93. Auxiliary amplifier 80b may also have two outputs: an auxiliary output 95 and an auxiliary termination port 97. Auxiliary output 95 may be connected to node 93. Signal power that would otherwise be lost at auxiliary termination port 97 may instead be coupled to node 93 through a phase delay module 99 and a transformer network 101. Phase delay module 99 ensures that the phase of the signal from auxiliary termination port 97 is compatible with the phase of the signal from auxiliary output 95. The transformer network 101 may be configured for optimal impedance matching at node 93. For impedance matching to a connected load, an additional transformer network 103 may be connected between node 93 and the output port 105 of system 90. This novel combination—a main distributed amplifier (DA) composed of multiple Doherty unit cells that receives an input and has a main output and a main termination port, an auxiliary DA composed of multiple Doherty unit cells that is coupled to the main termination port, and has an auxiliary output and an auxiliary termination port, a first phase delay module coupled between the main output and the auxiliary output, and a second phase delay module coupled between the auxiliary termination port and the auxiliary output—achieves a high-efficiency, wideband amplifying system suitable for RF, microwave, and other high frequency applications.

Optionally, a bias control module 107 may be connected between main output 85 of main amplifier 80*a* and an input of auxiliary amplifier 80*b* to allow for power-dependent adjustment of the bias control signal applied to auxiliary amplifier 80*b*. The bias control for auxiliary amplifier 80*b* may operate in a manner similar to the bias control of Doherty unit cell 70, so that the duty cycle of auxiliary amplifier 80*b* may be optimized for efficiency.

The design of system 90 advantageously avoids power loss in the termination loads of the DAs, thereby achieving high efficiency. Moreover, the phase delay modules and transforming circuits may be designed or selected as wideband circuits. Applying wideband amplifying techniques with wideband phase delay and transforming techniques to a series-type Doherty amplifier results in a wideband series-type Doherty amplifier. Thus, a design such as system 80 or 90 may achieve both high efficiency and wide bandwidth by combining series-type Doherty operation with the wideband characteristics of DAs, and by avoiding useless power losses in DA termination loads.

The concept of combining DAs and Doherty amplifiers disclosed herein is not limited to the specific embodiments shown and described. DAs may be constructed using the Doherty unit cells cascaded in any desired number and coupled between transmission lines to achieve wideband operation. Two or more DAs so constructed, or two or more CRTSSDAs, may be arranged in a series-type Doherty topology to maximize efficiency. By using the proper bias control, phase delay, and transforming circuits as herein described, Doherty amplifiers may be embedded within DAs, and DAs may be embedded within Doherty networks, in any of various combinations.

Exemplary embodiments of the invention have been disclosed in an illustrative style. Accordingly, the terminology employed throughout should be read in an exemplary rather than a limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A high efficiency, wideband amplifying system comprising:
    a main distributed amplifier comprising a main output and a main termination port;
    wherein the main distributed amplifier is configured to receive an input signal;
    an auxiliary distributed amplifier coupled to the main termination port and comprising an auxiliary output and an auxiliary termination port;
    a bias control module coupled between the auxiliary distributed amplifier and the main output of the main distributed amplifier;
    a first phase delay module coupled between the main output and the auxiliary output; and
    a second phase delay module coupled between the auxiliary termination port and the auxiliary output.

2. The amplifying system of claim 1, wherein the bias control module is configured to adjust an input bias of the auxiliary distributed amplifier responsive to at least one of power detected at the main output of the main distributed amplifier or power detected at the main input to the main distributed amplifier.

3. The amplifying system of claim 1, wherein the bias control module is configured to sample the main distributed amplifier output power at a sampling frequency.

4. The amplifying system of claim 1, wherein the bias control module is controlled to optimize switching efficiency.

5. The amplifying system of claim 1, wherein the bias control module monitors output of the main distributed amplifier to optimize the duty cycle of the auxiliary distributed amplifier.

6. The amplifying system of claim 1, wherein the bias control module is configured to adjust the bias voltage based on sensing of a DC current to the auxiliary distributed amplifier and determine a compression point based on the sensed DC current.

7. The amplifying system of claim 1, wherein the bias control module is configured to automatically adjust the input bias to the auxiliary distributed amplifier responsive to power detected at the output of the main distributed amplifier absent detecting power at the output of the auxiliary distributed amplifier.

8. The amplifying system of claim 1, wherein the bias control module is configured to:
    predict, based on the detected output power of the main distributed amplifier, the main distributed amplifier entering or the main distributed amplifier leaving saturation; and
    adjust the timing of the auxiliary distributed amplifier switching.

9. The amplifying system of claim 1, wherein at least one of the main distributed amplifier and the auxiliary distributed amplifier comprise multiple stages.

10. The amplifying system of claim 1, wherein at least one of the main distributed amplifier and auxiliary distributed amplifier comprises a Doherty unit cell.

11. The amplifying system of claim 10, wherein the Doherty unit cell comprises a cascaded reactively terminated single-stage distributed amplifier.

12. The amplifying system of claim 10, wherein the Doherty unit cell comprises
    a main amplifier having an output;
    an auxiliary amplifier; and
    a bias control automatically adjusting an input bias to the auxiliary amplifier responsive to at least one of power detected at the output of the main amplifier or power detected to the input of the main amplifier.

13. The amplifying system of claim 1, further comprising a transforming network coupled to at least one of the output of the first phase delay module and the output of the second phase delay module.

14. The amplifying system of claim 1, further comprising a transforming network coupled to the auxiliary output configured for impedance matching.

15. The amplifying system of claim 1, wherein signal power is recaptured through the second phase delay module and a transforming network via a coupling to the auxiliary output.

16. A high efficiency, wideband amplifying system comprising:
- a main distributed Doherty amplifier in series with an auxiliary distributed Doherty amplifier; and
- a bias control module coupled between the auxiliary distributed Doherty amplifier and a main output of the main distributed Doherty amplifier, wherein the bias control module is configured to adjust the bias voltage based on sensing of a DC current to the auxiliary distributed Doherty amplifier and further determining a compression point based on the sensed DC current.

17. A high efficiency, wideband amplifying system comprising:
- a main distributed Doherty amplifier in series with an auxiliary distributed Doherty amplifier;
- a bias control module coupled between the auxiliary distributed Doherty amplifier and a main output of the main distributed Doherty amplifier, and
- a transforming network configured for impedance matching coupled to at least one of an auxiliary distributed Doherty amplifier output and the main distributed Doherty amplifier output.

18. A high efficiency, wideband amplifying system comprising:
- a main distributed Doherty amplifier in series with an auxiliary distributed Doherty amplifier;
- a bias control module coupled between the auxiliary distributed Doherty amplifier and a main output of the main distributed Doherty amplifier, and
- phase delay modules coupled between at least two of:
    a) the main distributed Doherty amplifier output and an auxiliary distributed Doherty amplifier output;
    b) the auxiliary distributed Doherty amplifier output and the main distributed Doherty amplifier output; and
    c) an auxiliary distributed Doherty amplifier termination port and the auxiliary distributed Doherty amplifier output.

* * * * *